U S010776598B2

(12) United States Patent
Lee et al.

(10) Patent No.: US 10,776,598 B2
(45) Date of Patent: Sep. 15, 2020

(54) DISPLAY DEVICE WITH OPTICAL IMAGE SENSOR DEVICE FOR FINGERPRINT DETECTION

(71) Applicant: LG Display Co., Ltd., Seoul (KR)

(72) Inventors: Junghoon Lee, Incheon (KR); Guensik Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 409 days.

(21) Appl. No.: 15/838,143

(22) Filed: Dec. 11, 2017

(65) Prior Publication Data

US 2018/0365475 A1    Dec. 20, 2018

(30) Foreign Application Priority Data

Jun. 14, 2017   (KR) .................. 10-2017-0074776

(51) Int. Cl.
| | | |
|---|---|---|
| *G06K 9/00* | (2006.01) | |
| *H05K 1/18* | (2006.01) | |
| *H05K 1/11* | (2006.01) | |
| *G06F 3/041* | (2006.01) | |
| *H05K 1/02* | (2006.01) | |

(52) U.S. Cl.
CPC ....... *G06K 9/00013* (2013.01); *G06F 3/0412* (2013.01); *G06F 3/0416* (2013.01); *G06K 9/0004* (2013.01); *G06K 9/0008* (2013.01); *H05K 1/0274* (2013.01); *H05K 1/111* (2013.01); *H05K 1/181* (2013.01); *H05K 1/182* (2013.01); *H05K 1/116* (2013.01); *H05K 1/184* (2013.01); *H05K 2201/10106* (2013.01); *H05K 2201/10121* (2013.01); *H05K 2201/10128* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 10,410,036 B2* | 9/2019 | He | G06F 3/044 |
| 2010/0321152 A1* | 12/2010 | Argudyaev | G06K 9/00046 340/5.53 |
| 2016/0234361 A1* | 8/2016 | Baek | H04M 1/0262 |
| 2017/0193264 A1* | 7/2017 | Kim | H01L 24/48 |
| 2018/0288202 A1* | 10/2018 | Park | H04M 1/026 |
| 2018/0365475 A1* | 12/2018 | Lee | H05K 1/0274 |
| 2019/0073045 A1* | 3/2019 | Lei | G06K 9/00006 |
| 2020/0057467 A1* | 2/2020 | Kim | G06K 9/0002 |

FOREIGN PATENT DOCUMENTS

KR   10-2017-0044536 A   4/2017

\* cited by examiner

*Primary Examiner* — Tahmina N Ansari
(74) *Attorney, Agent, or Firm* — Fenwick & West LLP

(57) ABSTRACT

Disclosed herein is an optical image sensor device comprising a light source; a first printed circuit board (PCB) having a first through hole for accommodating the light source; a directional light unit configured to progress a light from the light source through a total refraction, and configured to converge light deviated from the total reflection by an object having biometric information when the object is placed to be adjacent to the directional light unit in a predetermined area, and emit it outside thereof; and an optical sensor between the first PCB and the directional light unit to receive the light emitted from the directional light unit.

20 Claims, 5 Drawing Sheets

DISPLAY DEVICE WITH OPTICAL IMAGE SENSOR DEVICE FOR FINGERPRINT DETECTION

CROSS-REFERENCE TO RELATED APPLICATION

This application claims the benefit of priority to Patent Application No. 10-2017-0074776 filed in Republic of Korea on Jun. 14, 2017, the entire contents of which is incorporated herein by reference in its entirety.

BACKGROUND

Field of the Technology

This disclosure relates to an optical image sensor device and a display device having the same, in particular to an optical image sensor device capable of recognizing a fingerprint using directional light and a display device having the same.

Description of the Related Art

In recent, according to development of information communication technology, various information and communication based systems such as a notebook computer, a tablet personal computer (PC), a smartphone, a personal digital assistant (PDA), an automated teller machine, and a search guidance system have been developed. As these systems typically store a lot of confidential data such as personal information related to personal privacy as well as business information and trade secrets, it is required to enhance security in order to protect the confidential data.

To do so, one method has been suggested for enhancing the security using an image sensor capable of recognizing a user's biological information. For example, a fingerprint sensor is known that can enhance the security of the systems by registering and authenticating a fingerprint of the user's finger. The fingerprint sensor is for sensing the fingerprint of the user. The fingerprint sensor may be classified into an optical fingerprint sensor and a capacitive fingerprint sensor.

The optical fingerprint sensor uses a principle of irradiating lights using a light source such as a light emitting diode (LED), and detecting the lights reflected by ridges of the fingerprint using a complementary metal oxide semiconductor (CMOS) image sensor. As the optical fingerprint sensor has to scan the fingerprint using the LED, it is required to equip an additional device for scanning the fingerprint. The additional device increases the size of the optical fingerprint sensor, and thus there are limitations in various applications such as combining with a display device.

Additional discussion regarding conventional optical fingerprint sensors is found in Republic of Korea Patent No. 10-060817 registered on Jun. 26, 2006 titled "Display device having fingerprint recognition sensor" and a Republic of Korea Patent Laid-open Publication No. 10-2016-0043216 published on Apr. 21, 2016 titled "Display device including fingerprint recognizing element".

The display devices disclosed in the above-mentioned publications are configured so that display areas of the display devices can be used as touch areas and fingerprint recognition areas. However, the optical fingerprint sensor uses diffused light with a significantly lower directionality or directivity as light for recognizing the fingerprint. Therefore, there is a limitation in recognizing patterns of the fingerprint. In order to solve such a problem, when a collimated light such as a laser beam having a high directionality is used, the size of the fingerprint recognition area is extremely limited because it is difficult to irradiate light for sensing the fingerprint to a large area. Also, as a scanning function has to be added to the optical fingerprint sensor to apply the collimated light having the high directionality to the wide area, there is a problem in that it is difficult to apply the optical fingerprint sensor to a portable display device.

In order to solve the problems of such optical fingerprint sensors, a capacitive fingerprint sensor has been developed.

The capacitive fingerprint sensor uses a difference in amount of electricity charged between ridges and valleys of the fingerprint in contact with the capacitive fingerprint sensor. Additional discussion regarding conventional optical fingerprint sensor is found in U.S. Patent Publication No. 2013/0307818 published on Nov. 21, 2013, titled "Capacitive Sensor Packaging."

The capacitive fingerprint sensor disclosed in the above-mentioned publication is configured as an assembly type coupled with a specific push button. The capacitive fingerprint sensor comprises a capacitive plate, and a silicon wafer on which a circuit for detecting capacitances between the ridges and valleys of the fingerprint is mounted. In general, as the sizes of the ridges and valleys of the fingerprint are very tiny, about 300 µm~about 500 µm, the capacitive fingerprint sensor of the Publication needs a high resolution sensor array and an integrated chip (IC) for processing the fingerprint detection. To this end, the silicon wafer capable of integrating the sensor array and the IC as one body is used.

However, when the high resolution sensor array and the IC are formed together using the silicon wafer, an assembly structure for joining the push button with the fingerprint sensor is required. Therefore, the structure would be very complex and further a non-display area (or bezel area) may be increased. Also, because the push button (for example, a home key of a smartphone) is overlapped with the fingerprint sensor, not only the thickness is increased but also a fingerprint sensing area is dependent on the size of the push button.

In order to solve such a problem, techniques of using area of a touch sensor screen as a fingerprint recognition area have been developed. Additional discussion regarding techniques of using area of a touch sensor screen as a fingerprint recognition area is found in U.S. patent application Ser. No. 13/856,4314 filed on Oct. 22, 2013, titled "Capacitive touch sensor for identifying a fingerprint" and Republic of Korea Patent No. 10-1432988 filed on Aug. 18, 2014, titled "Fingerprint sensor integrated type capacitive touch screen."

In general, a personal portable display device such as a smart phone is further provided with a protective film for protecting a display panel of the display device. In the case that the above-described technique is applied to a display area of the personal portable display device as a fingerprint recognition area, if the protective film is attached to the display panel, the capacitive fingerprint recognition function may be significantly deteriorated due to its thickness. Even if the protective film is attached to the display panel, the touch function can be used as it is. However, in the case of fingerprint recognition, since very minute fingerprint needs to be recognized, a minute change in capacitance has to be detected. For this purpose, it may be considered that making the protective film thin. However, if the thickness of the protective film is too thin, it is not possible to obtain the protective purpose of the display panel, thereby restricting to make the thickness of the protective film thin. Accordingly, there is a limit to accurately detecting the change in capacitance required to recognize a fine fingerprint using the capacitive fingerprint sensor.

As described above, in the display device having the conventional optical fingerprint sensor, it is difficult to accurately recognize fingerprint, or the complicated and bulky optical device is required. Accordingly, it is difficult for them to be combined with a portable display device. Further, in the display device having the conventional capacitive fingerprint sensor, there is a problem that it is difficult to accurately recognize the fingerprint due to the protective film.

SUMMARY

An object of this disclosure is to provide an optical image sensor device capable of recognizing a fine fingerprint without reducing a thickness of a cover substrate and a display device having the same.

Another object of this disclosure is to provide an optical image sensor device capable of improving connectivity between a first PCB and a second PCB by arranging the first PCB on which a light source is mounted and the second PCB on which drive circuits of a display device are mounted on a same side.

An optical image sensor device according to this disclosure includes a light source; a first printed circuit board (PCB) having a first through hole for accommodating the light source; a directional light unit configured to progress a light from the light source through a total refraction, and configured to converge light deviated from the total reflection by an object having biometric information when the object is placed to be adjacent to the directional light unit in a predetermined area, and emit it outside thereof; and an optical sensor between the first PCB and the directional light unit to receive the light emitted from the directional light unit.

The optical image sensor device further includes a reinforced plate having a second through hole that matches the first through hole to accommodate the light source and disposed on a first surface of the first PCB.

The first PCB includes a pad portion on a second surface of the first PCB opposite to the first surface to supply electric energy to the light source, and the light source is connected to the pad portion through a lead wire on the second surface of the first PCB.

The directional light unit includes a cover substrate having a predetermined size; a low refractive layer neighboring to the light source; and an optical film between the cover substrate and the low refractive layer having a light-incident element configured to refract the light supplied from the light source so as to enter the light into the cover substrate, and a light-converging element configured to converge the light refracted by the object in contact with the cover substrate and advance it to the outside of the directional light unit.

The light-incident element is corresponding to the light source.

The light-converging element is corresponding to the predetermined area.

The optical sensor is corresponding to the light-converging element.

The optical image sensor device further includes a black matrix disposed on one end of the cover substrate and having an opening at a position corresponding to the light source.

The optical sensor is disposed on any one of a light emitting surface of the directional light unit corresponding to the predetermined area and a surface of the first PCB facing the directional light unit. The light emitting surface may be a surface of the directional light unit where the light deviated from the total reflection emits out.

The light source is configured to supply a collimated light.

The light-incident element may convert the collimated light into a progressing light with a predefined diffusion angle.

The object having biometric information may include a finger having fingerprint information.

The light emitted from the directional light unit may reflect the fingerprint information of the finger.

The predetermined area may at least be based on the location and size of the optical sensor.

A display device according to this disclosure includes the optical image sensor device described above, and a display panel between the first PCB and the directional light unit.

The display device further includes an optical sensor connection portion having a first end connected to the optical sensor and a second end; and a second PCB on which a driving IC for driving display panel is mounted, wherein the second PCB has a third end connected to one edge of the display panel, a first extension portion extended from the third end to be connected to the second end of the optical sensor connection portion, and a second extension extended from the first extension portion to be connected to a host system outside the display panel.

The first PCB is disposed on a first side of the display device and the second PCB is disposed on a second side of the display device opposite to the first side.

The first PCB and the second PCB are connected to each other through the host system.

The display device further includes a third PCB on which a touch IC for driving and sensing a touch sensor of the display panel is mounted, wherein the first PCB is connected to the host system through the third PCB.

The first PCB and the second PCB are directly connected to each other, and the second PCB is connected to the host system.

The first PCB is adjacent and directly connected to the second PCB.

According to the optical image sensor device according to this disclosure described above, it is possible to recognize a fine fingerprint using the directional light unit, so that the fine fingerprint can be recognized without reducing the thickness of the cover substrate.

In addition, if the optical image sensor device according to this disclosure described above is applied to a display device, the first PCB for accommodating the light source can be disposed on the same side as a second PCB on which driver circuits of the display device are mounted, so that the first PCB and the second PCB can be easily connected.

BRIEF DESCRIPTION

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Hereinafter, embodiments of this disclosure are described in detail with reference to the accompanying drawings. In the specification, the same reference numerals denote the same elements. In the following description, a detailed description of the known functions and constitutions will be omitted if it is deemed to obscure the embodiments of the present invention. Furthermore, the names of elements used in the following description have been selected by taking into consideration only the ease of writing this specification and may be different from the names of actual parts. Also, as an example of a touch sensor integrated type display device, a touch sensor integrated type liquid crystal display device will be described in detail.

An optical image sensor device according to an embodiment of this disclosure is described below with reference to FIGS. 1A and 1B.

Figure 1A:
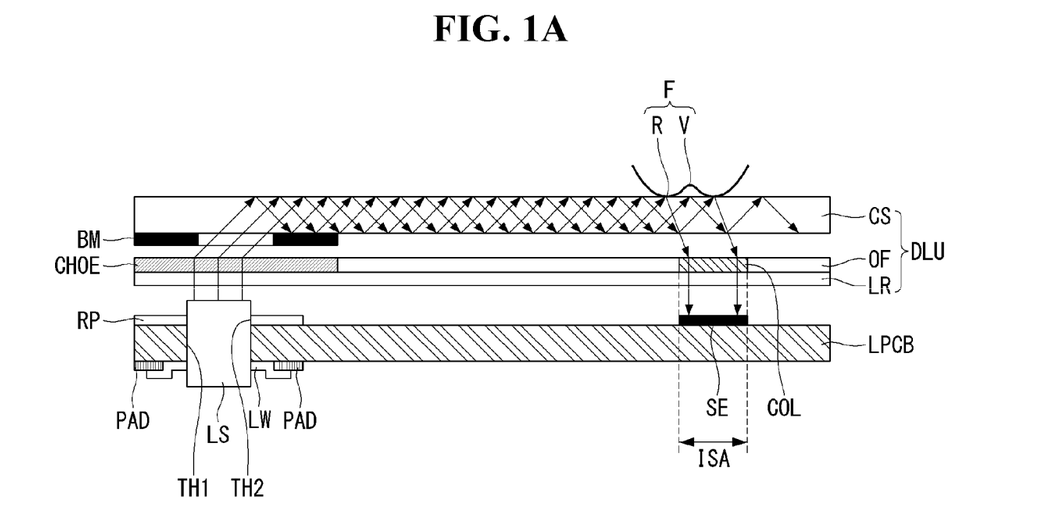
FIG. 1A is a cross-sectional view illustrating an optical image sensor device according to an embodiment of this disclosure.
Figure 1B:
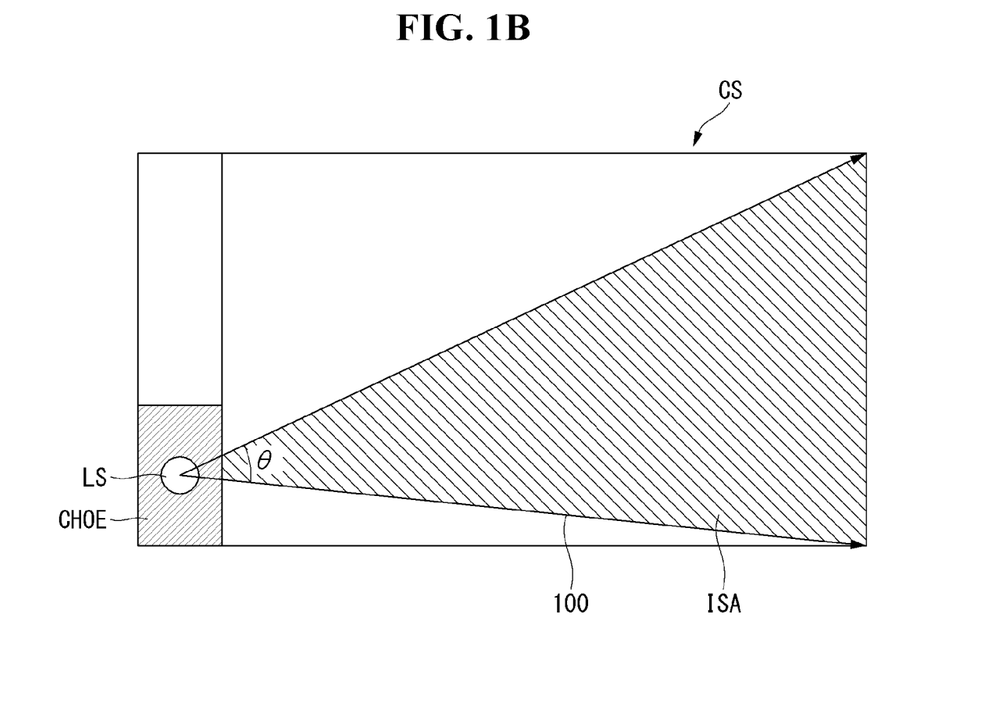
FIG. 1B is a planar view for explaining an image sensing area defined by a traveling path of light emitted from a light source of an optical image sensor device according to an embodiment of this disclosure.

FIG. 1A is a cross-sectional view illustrating an optical image sensor device according to an embodiment of this disclosure, and FIG. 1B is a planar view for explaining an image sensing area defined by a traveling path of light emitted from a light source of an optical image sensor device according to an embodiment of this disclosure.

Referring to FIG. 1A, the optical image sensor device according to the embodiment of this disclosure includes a first printed circuit board (PCB) LPCB on which a light source LS is mounted, a directional light unit DLU for progressing the light from the light source LS and emitting outside of the directional light unit DLU, and an optical sensor SE for sensing or detecting the light from the directional light unit DLU.

As the light source LS, it is preferable to use a light source that supplies a collimated light capable of providing a light having a high collimation, such as an infrared laser.

The first PCB LPCB includes a first through hole TH1 for receiving the light source LS at one end thereof. The first PCB LPCB also includes a reinforced plate RP and pad portions PAD. The reinforced plate RP includes a second through hole TH2 that matches the first through hole TH1 to receive the light source CS. The reinforced plate RP is disposed on a first surface of the first PCB LPCB. The reinforced plate RP can stably control the distance between the light source LS and the directional light unit DLU by adjusting the thickness of the reinforced plate RP. The reinforcing plate RP may also function as a heat sink capable of releasing heat generated from the light source LS to the outside. The pad portions PAD are disposed on a second surface of the first PCB LPCB opposite to the first surface so as to supply electric energy from the outside to the light source LS. The light source LS is connected to the pad portions PAD through lead wirings LW on the second surface of the first PCB LPCB.

The directional light unit DLU advances the light supplied from the light source LS through a total reflection, and concentrates and emits light deviating from total reflection by an object having biometric information in a predetermined area.

The directional light unit DLU includes a cover substrate CS, a low refractive layer LR, and an optical film OF.

The cover substrate CS includes a predetermined area capable recognizing the object having biometric information. The predetermined area may include an image sensing area ISA as shown in FIG. 1B. The cover substrate CS may be made of a transparent tempered glass having a refractive index of about 1.5. A black matrix BM having an opening at a position corresponding to the light source LS is attached to one end of the cover substrate CS. The object having biometric information may include a finger having a fingerprint.

The low refractive layer LR is disposed to face the first surface of the first PCB LPCB so as to be adjacent to the light source LS. It is preferable that the low refractive layer LR has a refractive index lower than that of the cover substrate CS and a light-converging element to be described later. The refractive index of the low refractive layer LR is preferably similar to the refractive index of the object to be recognized. For example, when the optical image sensor device is applied to a fingerprint recognition, the low refractive layer LR may have a refractive index of about 1.4 which is similar to the refractive index of human skin, about 1.39.

The optical film OF includes a light-incident element CHOE and a light-converging element COL, which are disposed between the cover substrate CS and the low refractive index layer LR. The light-incident element CHOE and the light-converging element COL may be transparent holographic recording films having a refractive index equal to or slightly larger than that of the cover substrate CS.

The light-incident element CHOE converts the light supplied from the light source LS into a progressing light 100. The progressing light 100 may have a constant diffusion angle θ in a horizontal plane consisting of a longitudinal axis and a width-directional axis. In addition, the progressing light 100 maintains an original collimated state in a vertical plane consisting of the longitudinal axis and a thickness-directional axis. Herein, the diffusion angle θ may be set to be equal to or greater than an inside angle formed by two line segments connecting an incident point at which light is incident and two end points to which the progressing light 100 travels on the other side of the cover substrate CS. The progressing light 100 advances while spreading in a triangular shape having a diffusion angle θ, and an area occupied by the diffusion of the progressing light 100 becomes an image sensing area ISA. Although the image sensing area ISA is shown as a triangular shape in FIG. 1B, it is possible that the image sensing area ISA may also be formed of any other shape, for example, a trapezoid shape, a polygon shape, etc., depending on the shape of the cover substrate CS and the diffusion angle θ.

If no object is present on the surface of the cover substrate CS, the progressing light 100 is totally reflected in the cover substrate CS and advances inside the cover substrate CS. However, if there is an object on the surface of the cover substrate CS, some of the progressing light 100 are refracted by the object and are emitted to the outside of the cover substrate CS. For example, if a finger is brought into contact with the image sensing area ISA of the cover substrate CS, the progressing light 100 advancing to the ridge R of the fingerprint of the finger F is refracted by the ridge R of the fingerprint F and comes out to the outside of the cover substrate CS (i.e. the outside of the lower surface of the cover substrate). On the other hand, the progressing light 100 proceeding to the valley V of the fingerprint F is totally reflected in the cover substrate CS and proceeds in the cover substrate CS. In another example, if a finger is placed to be adjacent to but not in contact with the image sensing area ISA of the cover substrate CS, the progressing light 100 may also be refracted by the ridge R of the fingerprint F and comes out to the outside of the cover substrate CS. Accordingly, the refraction of the progressing light 100 may also occur when the finger is enough close to the image sensing area ISA but not in actually physical contact with the image sensing area ISA.

The light-converging element COL converges some of the progressing light 100 traveling in the cover substrate CS and emits them to the outside of the directional light unit DLU. If an object having an image (for example, a fingerprint of a human's finger) comes into contact with the upper surface of the cover substrate CS, the light-converging element COL converges some of the progressing light 100 refracted by the finger and emits them to the outside of the directional light unit DLU.

The optical sensor SE is disposed between the first PCB LPCB and the directional light unit DLU. For example, the optical sensor SE may be disposed on a first surface of the first PCB LPCB or on a lower surface of the low refractive layer LR of the directional light unit DLU. The optical sensor SE receives the light emitted through the low refractive index layer LR of the directional light unit DLU. Additionally, the optical sensor SE may further process the light received from the directional light unit DLU, so as to determine an image pattern of the object, and then transmit the image pattern to a host system (not shown).

According to the optical image sensor device according to the embodiment of this disclosure described above, it is possible to recognize a fine fingerprint using the directional light unit DLU, so that the fine fingerprint can be recognized without reducing the thickness of the cover substrate CS.

In addition, in the optical image sensor device, since the light source LS is accommodated in the first through hole TH1 passing through the first PCB LPCB, the light source LS supplies light from a front side (i.e., a first surface side) of the first PCB LPCB to the directional light unit DLU, and the first PCB is disposed under the directional light unit DLU. Accordingly, if the optical image sensor device is applied to a display device, the first PCB LPCB can be disposed on the same side as a second PCB on which driver circuits of the display device are mounted, so that the first PCB and the second PCB can be easily connected.

Next, a display device having the optical image sensor device according to the embodiment of this disclosure will be described with reference to FIG. 2.

Figure 2:
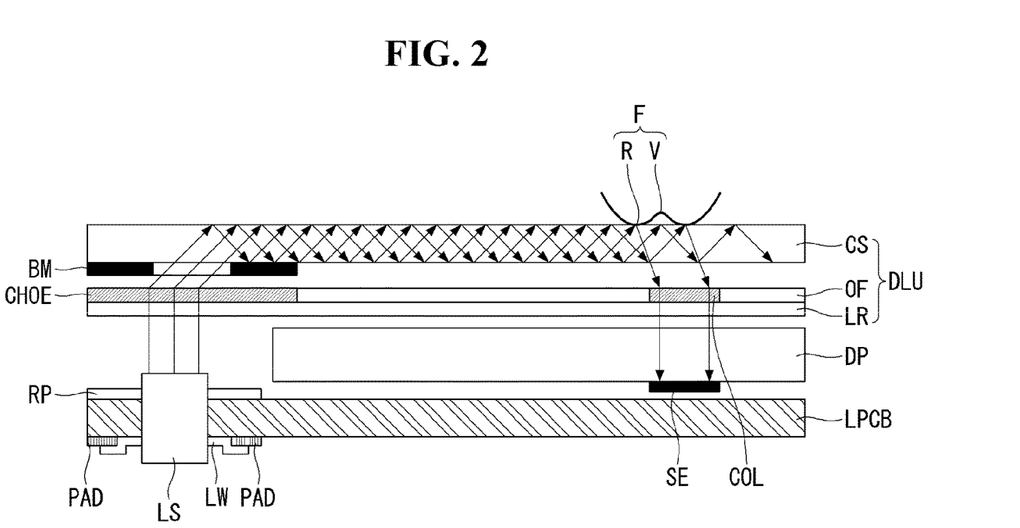
FIG. 2 is a cross-sectional view illustrating a schematic structure of a display device having the optical image sensor device according to the embodiment shown in FIG. 1A.

FIG. 2 is a cross-sectional view illustrating a schematic structure of a display device having the optical image sensor device according to the embodiment shown in FIG. 1A.

Referring to FIG. 2, the display device includes an optical image sensor device according to this disclosure and a display panel DP.

The optical image sensor device includes a first PCB LPCB, a directional light unit DLU, and an optical sensor SE. Since the optical image sensor device has been fully described in the detailed description of this disclosure relating to FIGS. 1A and 1B, a detailed description thereof will be omitted herein to obviate redundant explanations.

The display panel DP is disposed between the directional light unit DLU of the optical image sensor device and the first PCB LPCB.

The optical sensor SE is disposed between the display panel DP and the first PCB LPCB. For example, the optical sensor SE may be disposed on a lower surface of the display panel DP facing the first PCB LPCB, or on a first surface of the first PCB LPCB facing the directional light unit DLU.

As the display panel DP, a liquid crystal display (LCD) panel, a plasma display panel (PDP), a field emission display (FED) panel, an electroluminescence display panel and so on may be used.

In the display device having the optical image sensor device according to the embodiment of this disclosure, the first PCB LPCB is disposed on the same side as the second PCB on which driver circuits of the display device are mounted because the display panel DP is disposed between the first PCB LPCB and the directional light unit DLU. Therefore, the first PCB and the second PCB can be easily connected to each other.

Next, examples of the display device with the optical image sensor device, which have a construction of connecting a first PCB on which a light source LS is mount to a second PCB on which driver circuits (e.g., driving ICs), will be described with reference to FIGS. 3 to 5.

Figure 3:
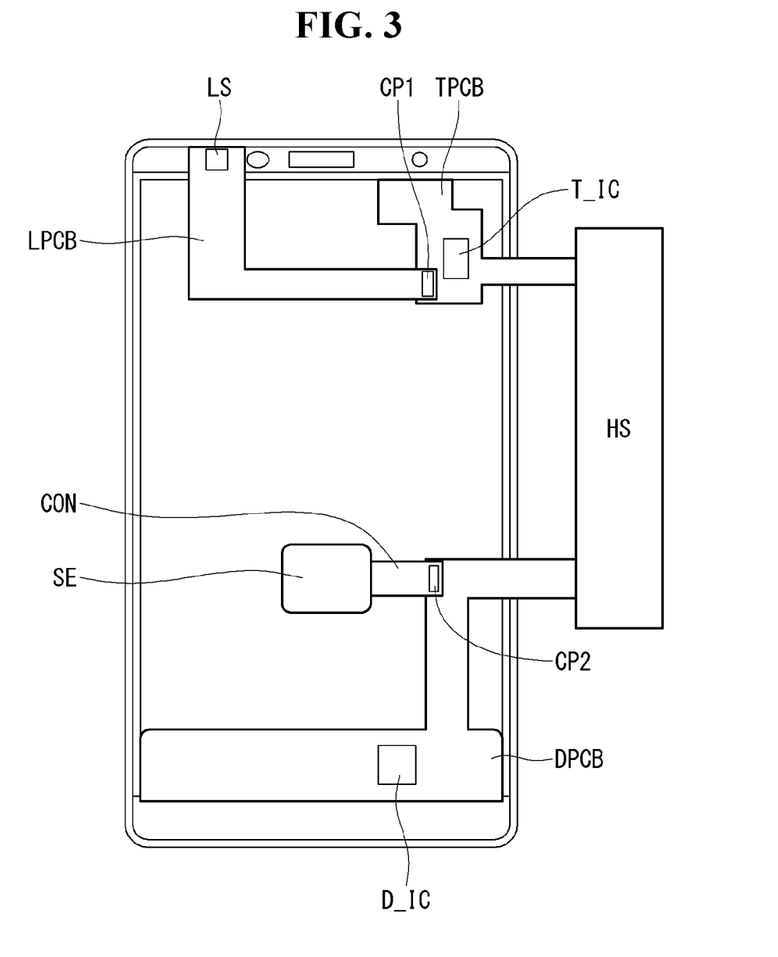
FIG. 3 is a planar view illustrating a first example of the display device having the optical image sensor device according to the embodiment of this disclosure.

FIG. 3 is a planar view illustrating a first example of the display device having the optical image sensor device according to the embodiment of this disclosure. FIG. 4 is a planar view illustrating a second example of the display device having the optical image sensor device according to the embodiment of this disclosure. FIG. 5 is a planar view illustrating a third example of the display device having the optical image sensor device according to the embodiment of this disclosure.

Referring to FIG. 3, a first example of the display device including the optical image sensor device according to the embodiment of this disclosure includes a first PCB LPCB in which a light source LS is accommodated, a second PCB DPCB on which a display IC D_IC for driving display elements of the display panel DP is mounted, a third PCB TPCB on which a touch IC T_IC for driving and sensing a touch sensor of the display panel is mounted, and an optical sensor SE.

The first PCB LPCB and the third PCB TPCB are disposed to be separated from each other on a first side (for example, an upper side of the drawing) of the display device. The first PCB LPCB and the third PCB TPCB may be connected to each other by a film on film type at a first connection position CP1. The third PCB TPCB is connected to an external host system HS.

The second PCB DPCB is disposed on a second side (for example, a lower side of the drawing) of the display device which is opposite to the first side of the display device. At a second connection position CP2, the second PCB DPCB is connected to a connection portion CON to which the optical sensor SE is connected.

Accordingly, the first PCB LPCB may be connected to the second PCB DPCB via the third PCB TPCB and the host system HS, and the optical sensor SE may be connected to the host system HS via the second PCB DPCB.

The host system HS may supply signals for driving the light source LS, the touch IC T_IC, the display IC, and the optical sensor SE.

Hereinafter, the first PCB LPCB, the second PCB DPCB, and the third PCB TPCB will be described in more detail.

The first PCB LPCB includes one end having a first through hole TH1 for receiving the light source LS at the first side of the display device, a first extension portion extended from the one end to an the second side opposite to the first side of the display device, and a second extension portion extended from the first extension portion to a third side (for example, a right-handed side of the display device.

The third PCB TPCB includes one end having pads for sending or receiving signals to or from touch sensors at the first side of the display device, a first extension portion extended from the first side to the second side, and a second extension portion extended from the first extension portion to the third side of the display device. The second extension portion is extended to the outside of the display device and connected to the host system HS. The second extension portion of the first PCB LPCB is connected to the first extension portion of the third PCB TPCB at the first connection position CP1.

The second PCB DPCB includes one end having pads for sending or receiving signals to or from display elements for driving the display panel at the second side of the display device, a first extension portion extended from the second side to the first side, and a second extension portion extended from the first extension portion to the third side of the display device. The second extension portion of the second PCB DPCB is connected to the external host system HS.

The connection portion CON has one end connected to the optical sensor SE and another end connected to the second extension portion of the second PCB DPCB.

In the example shown in FIG. 3, the touch IC TIC and the third PCB TPCB on which the touch IC T_IC is mounted may be omitted. In this case, the second extension portion of the second PCB DPCB is connected to the second extension portion of the first PCB LPCB via the host system HS since the first PCB LPCB has to be connected to the host system HS.

Figure 4:
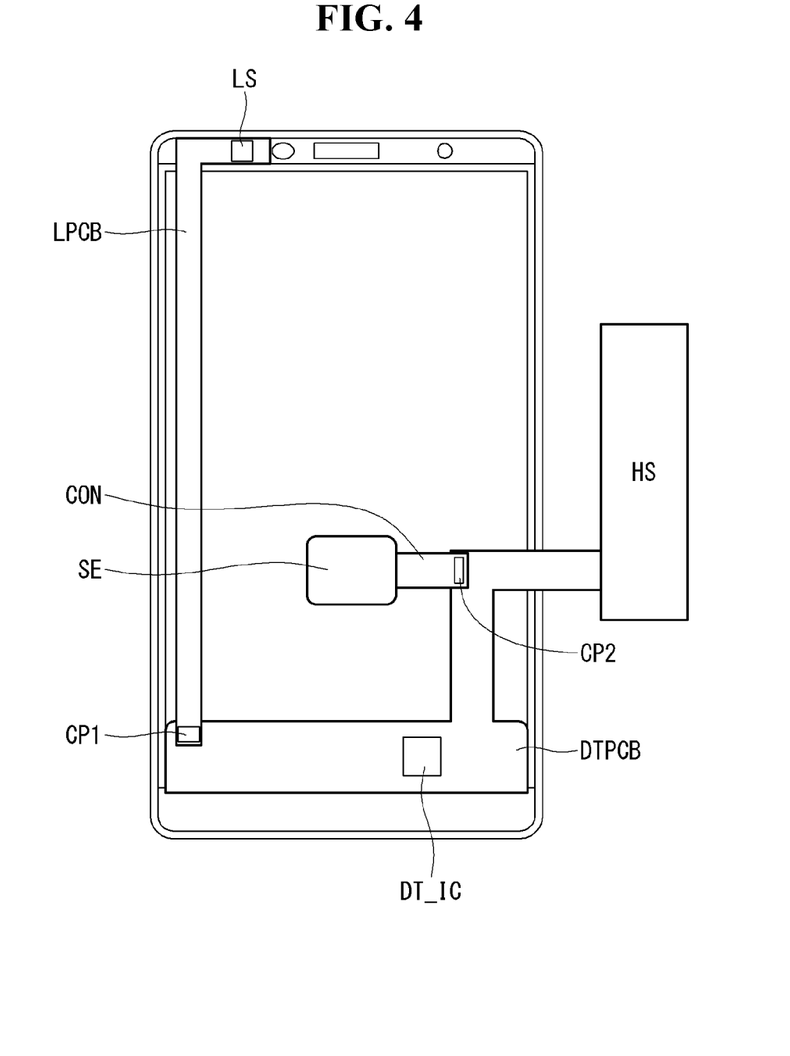
FIG. 4 is a planar view illustrating a second example of the display device having the optical image sensor device according to the embodiment of this disclosure.

Referring to FIG. 4, a second example of the display device including the optical image sensor device according to the embodiment of this disclosure includes a first PCB LPCB in which a light source LS is accommodated, a second PCB DTPCB on which a display-touch IC DT_IC for driving touch sensors and display elements of the display panel DP is mounted, and an optical sensor SE.

The first PCB LPCB is disposed to be extended from a first side (for example, an upper side of the figure) of the display device to a second side (for example, a lower side of the figure) opposite to the first side. The first PCB LPCB includes one end having a first through hole TH1 for receiving the light source LS at the first side of the display device, and a first extension portion extended from the one end to the second side of the display device.

The second PCB DTPCB is disposed on the second side of the display device opposite to the first side of the display device. The second PCB DTPCB includes one end having pads for sending or receiving signals to or from touch sensors and display elements at the second side of the display device, a first extension portion extended from the second side to the first side of the display device, and a second extension portion extended from the first extension portion to a third side (for example, a right-handed side) of the display device. The one end of the second PCB DTPCB is connected to the first extension portion of the first PCB LPCB in a film on film type. The first extension portion or second extension portion of the second PCB DTPCB is connected to the connection portion CON connected to the optical sensor SE at a second connection position CP2. Also, the second extension portion of the second PCB is connected to the external host system HS.

The optical sensor SE is connected to the second PCB DTPCB via a connection portion CON. The connection portion CON has one end connected to the optical sensor SE and another end connected to the second extension portion of the second PCB DTPCB.

The host system HS may supply signals for driving the light source LS, the display-touch IC DT_IC, and the optical sensor SE.

In the example shown in FIG. 4, the display-touch IC DT_IC may be replaced with a display IC if a touch function is not required.

Figure 5:
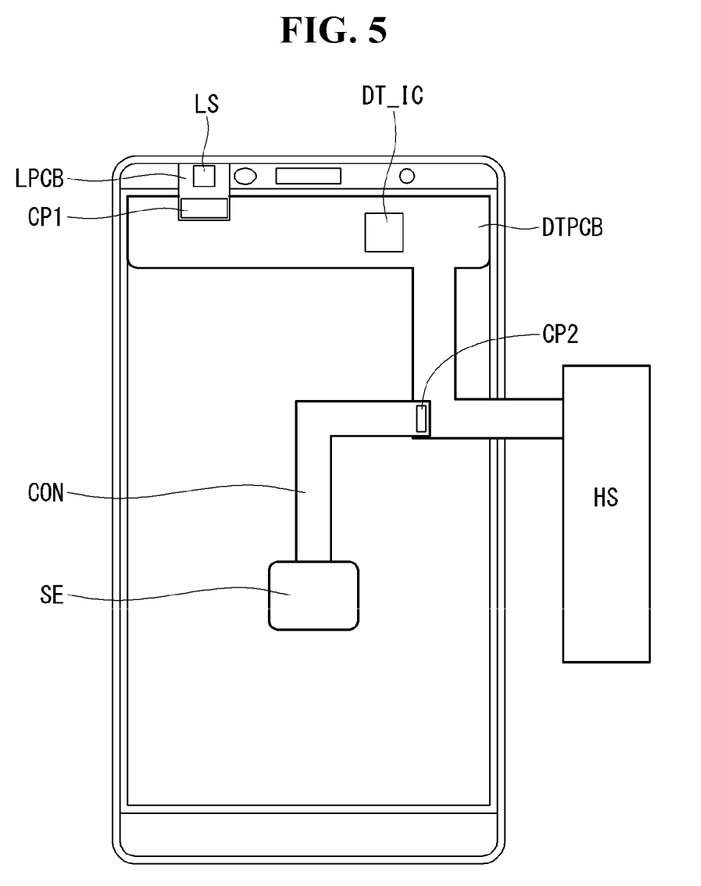
FIG. 5 is a planar view illustrating a third example of the display device having the optical image sensor device according to the embodiment of this disclosure.

Referring to FIG. 5, a third example of the display device including the optical image sensor device according to the embodiment of this disclosure includes a first PCB LPCB in which a light source LS is accommodated, a second PCB DTPCB on which a display-touch IC DT_IC for driving touch sensors and display elements of the display panel DP is mounted, and an optical sensor SE.

The first PCB LPCB is disposed to be extended from a first side (for example, an upper side of the figure) of the display device to a second side (for example, a lower side of the figure) opposite to the first side. The first PCB LPCB includes one end having a first through hole TH1 for receiving the light source LS at the first side of the display device, and a first extension portion extended from the one end to the second side of the display device.

The second PCB DTPCB is disposed on the first side of the display device neighboring to the first PCB LPCB. The second PCB DTPCB includes one end having pads for sending or receiving signals to or from touch sensors and display elements at the first side of the display device, a first extension portion extended from the first side to the second side of the display device, and a second extension portion extended from the first extension portion to a third side (for example, a right-handed side) of the display device. The one end of the second PCB DTPCB is connected to the first extension portion of the first PCB LPCB in a film on film type at a first connection position CP1. The first extension portion or second extension portion of the second PCB DTPCB is connected to a connection portion CON connected to the optical sensor SE at a second connection position CP2. Also, the second extension portion of the second PCB is connected to the external host system HS.

The optical sensor SE is connected to the second PCB DTPCB via the connection portion CON. The connection portion CON has one end connected to the optical sensor SE and another end connected to the second extension portion of the second PCB DTPCB.

The host system HS may supply signals for driving the light source LS, the display-touch IC DT_IC, and the optical sensor SE.

In the example shown in FIG. 5, the display-touch IC DT_IC may be replaced with a display IC if a touch function is not required.

According to the display device having the optical image sensor device of this disclosure, the first PCB for accommodating the light source can be disposed on the same side as a second PCB on which driver circuits of the display device are mounted, so that the first PCB and the second PCB can be easily connected, thereby improving a connectivity between the first PCB and the second PCB.

Those skilled in the art will understand that the present invention may be changed and modified in various ways without departing from the technical spirit of the present invention through the aforementioned contents. Accordingly, the technical scope of the present invention is not limited to the contents described in the detailed description of the specification, but should be determined by the claims.

What is claimed is:

1. An optical image sensor device, comprising:
   a light source configured to emit light for fingerprint sensing;
   a first printed circuit board (PCB) having a first through hole, wherein the light source is disposed within the first through hole of the first PCB;
   a directional light unit overlapping the light source, the directional light unit configured to progress the light from the light source through a total reflection, and configured to converge light deviated from the total reflection by a finger placed on the directional light unit in a predetermined area, and cause the light deviated from the total reflection to be emitted outside of the directional light unit; and
   an optical sensor between the first PCB and the directional light unit to receive the light emitted from the directional light unit for the fingerprint sensing of the finger.

2. The optical image sensor device of claim 1, further comprising a reinforced plate having a second through hole that matches the first through hole to accommodate the light source, the reinforced plate disposed on a first surface of the first PCB.

3. The optical image sensor device of claim 2, wherein the first PCB includes a pad portion on a second surface of the first PCB opposite to the first surface to supply electric energy to the light source, and
   the light source is connected to the pad portion through a lead wire on the second surface of the first PCB.

4. The optical image sensor device of claim 1, wherein the directional light unit includes:
   a cover substrate having a predetermined size;
   a low refractive layer neighboring to the light source; and
   an optical film between the cover substrate and the low refractive layer, the optical film having a light-incident element configured to refract the light supplied from the light source so as to enter the light into the cover substrate, and a light-converging element configured to converge the light refracted by the finger in contact with the cover substrate and advance it to the outside of the directional light unit.

5. The optical image sensor device of claim 4, wherein the light-incident element overlaps the light source.

6. The optical image sensor device of claim 4, wherein the light-converging element is disposed in the predetermined area.

7. The optical image sensor device of claim 6, wherein the optical sensor overlaps the light-converging element.

8. The optical image sensor device of claim 6, further comprising a black matrix disposed on one end of the cover substrate and having an opening at a position corresponding to the light source.

9. The optical image sensor device of claim 1, wherein the optical sensor is disposed on any one of a light emitting surface of the directional light unit in the predetermined area and a surface of the first PCB facing the directional light unit.

10. The optical image sensor device of claim 1, wherein the light source is configured to supply a collimated light.

11. The optical image sensor device of claim 4, wherein the light source is configured to supply a collimated light, and the light-incident element is configured to convert the collimated light into a progressing light with a predefined diffusion angle.

12. The optical image sensor device of claim 1, wherein the light emitted from the directional light unit reflects the fingerprint information of the finger.

13. The optical image sensor device of claim 1, wherein the predetermined area is based on a location and a size of the optical sensor.

14. A display device comprising:
   the optical image sensor device of claim 1; and
   a display panel between the first PCB and the directional light unit.

15. The display device of claim 14, further comprising:
   an optical sensor connection portion having a first end and a second end, the first end connected to the optical sensor; and
   a second PCB on which a driving IC for driving display panel is mounted, wherein the second PCB has an end connected to one edge of the display panel, a first extension portion extended from the end of the second PCB to be connected to the second end of the optical sensor connection portion, and a second extension extended from the first extension portion to be connected to a host system outside the display panel.

16. The display device of claim 15, wherein the first PCB is disposed on a first side of the display device and the second PCB is disposed on a second side of the display device opposite to the first side.

17. The display device of claim 16, wherein the first PCB and the second PCB are connected to each other through the host system.

18. The display device of claim 17, further comprising:
   a third PCB on which a touch IC for driving and sensing a touch sensor of the display panel is mounted,
   wherein the first PCB is connected to the host system through the third PCB.

19. The display device of claim 16, wherein the first PCB and the second PCB are directly connected to each other, and the second PCB is connected to the host system.

20. The display device of claim 15, wherein the first PCB is adjacent and directedly connected to the second PCB.

* * * * *